US006800548B2

(12) United States Patent
Andideh

(10) Patent No.: US 6,800,548 B2
(45) Date of Patent: Oct. 5, 2004

(54) METHOD TO AVOID VIA POISONING IN DUAL DAMASCENE PROCESS

(75) Inventor: Ebrahim Andideh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 41 days.

(21) Appl. No.: 10/040,224

(22) Filed: Jan. 2, 2002

(65) Prior Publication Data

US 2003/0124836 A1 Jul. 3, 2003

(51) Int. Cl.$^7$ ......................................... H01L 21/4763
(52) U.S. Cl. ........................ 438/627; 438/637; 438/643; 438/653; 438/687; 438/700; 438/761
(58) Field of Search ........................ 438/627, 634, 438/637, 643, 653, 672, 675, 687, 688, 700, 706, 724, 761; 257/751, 750

(56) References Cited

U.S. PATENT DOCUMENTS

| | | | | | |
|---|---|---|---|---|---|
| 5,045,870 | A | * | 9/1991 | Lamey et al. | 346/140 R |
| 5,187,119 | A | * | 2/1993 | Cech et al. | 437/187 |
| 6,222,269 | B1 | * | 4/2001 | Usami | 257/758 |
| 6,365,529 | B1 | * | 4/2002 | Hussein et al. | 438/780 |
| 6,392,254 | B1 | * | 5/2002 | Liu et al. | 257/59 |
| 6,448,185 | B1 | * | 9/2002 | Andideh et al. | 438/706 |

OTHER PUBLICATIONS

Pllentier, Ivan et al., "Dual Damascene Back–end Patterning Using 248nm and 193nm Lithography", Semiconductor Fabtech, 13th edition, pp. 227–234.

Hsia, Wei–Jen et al., "Flowfill Technology Low–Dielectric–Constant Materials", Semiconductor Fabtech, 10th edition, pp. 291–293.

Mills, Michael E. and McClear, Mark, "Integration Challenges of the Low–k Roadmap", http://www.future–fab.com/documents, Oct. 18, 2001, eight pages.

"Copper, with and without Damascene", http://www.semi-conductors.net/technical/damascene_copper.htm; Oct. 19, 2001, four pages.

"Damascene technology", http://www.cyberfab.net/training/selfstudy/damascene_technology_1.html; Oct. 19, 2001, eight pages.

Bursky, Dave, "The Wisdom of the Ancients Meets VLSI", http://www. planetee.com/planetee/servlet; Oct. 19, 2001, two pages.

"Chemical Vapor Deposition (CVD): How Performance Materials Creates High–Performance Silicon Carbide Products", http://www.performancematerial.com; Oct. 23, 2001, two pages.

"PECVD", http://ww.ionic.com/PECVD/pecvd.htm Oct. 23, 2001; 2 pages.

Seaward, K.L. and Jezl, M.L., "Using Plasma Energetics to Influence Silicon Nitride Step Coverage", presented Thursday, Oct. 5, 2000 in Session: Fundamental of Plasma Enhanced Chemical Vapor Deposition; http://www.cae.wisc.edu; one page.

* cited by examiner

*Primary Examiner*—Hsien Ming Lee
(74) *Attorney, Agent, or Firm*—Blakeky, Sokoloff, Taylor & Zafman LLP

(57) ABSTRACT

A method of forming a semiconductor device is described comprising forming a first patterned conductive layer on a dielectric on a substrate. A first barrier layer comprising silicon nitride is formed on the surface of the first patterned conductive layer, followed by forming a second barrier layer comprising silicon carbide on the surface of the first barrier layer. Using standard lithographic techniques a via and a trench are formed to the surface of the conductive layer.

18 Claims, 6 Drawing Sheets

METHOD TO AVOID VIA POISONING IN DUAL DAMASCENE PROCESS

BACKGROUND OF THE INVENTION

1. Field of the Invention

The present invention relates to a method for making semiconductor devices.

2. Background of the Invention

The dual damascene process is widely used in semiconductor device fabrication. As part of fabricating the semiconductor device using the dual damascene fabrication process a conductive layer is formed on a substrate. Next, a barrier layer made from either silicon nitride or silicon carbide is deposited on the conductive layer to act as an etch stop. Shunt metal layers such as cobalt or tungsten may be used as a copper diffusion barrier.

The use of silicon nitride by itself as a barrier layer is undesirable due to its high dielectric constant (k).

The use of silicon carbide by itself as a barrier layer is also undesirable because silicon carbide has organic components and these organic components cause "via poisoning". As a result, these contaminants cause an undesirably high via resistance. Moreover, Silicon carbide is not a hermetic sealer, allowing undesirable moisture to diffuse through it causing undesirable effects in the semiconductor device.

BRIEF SUMMARY OF THE DRAWINGS

Examples of the present invention are illustrated in the accompanying drawings. The accompanying drawings, however, do not limit the scope of the present invention. Similar references in the drawings indicate similar elements.

DETAILED DESCRIPTION OF THE INVENTION

Described is a method to avoid via poisoning in a dual damascene process used during fabrication of a semiconductor device. The described method also reduces line-to-line capacitance in the interconnects of the semiconductor device. In the following description, numerous specific details are set forth in order to provide a thorough understanding of the present invention. It will be apparent, however, to one of ordinary skill in the art that the present invention may be practiced without these specific details. In other instances, well-known architectures, steps, and techniques have not been shown to avoid unnecessarily obscuring the present invention.

Parts of the description will be presented using terminology commonly employed by those skilled in the art to convey the substance of their work to others skilled in the art.

Figure 1A:
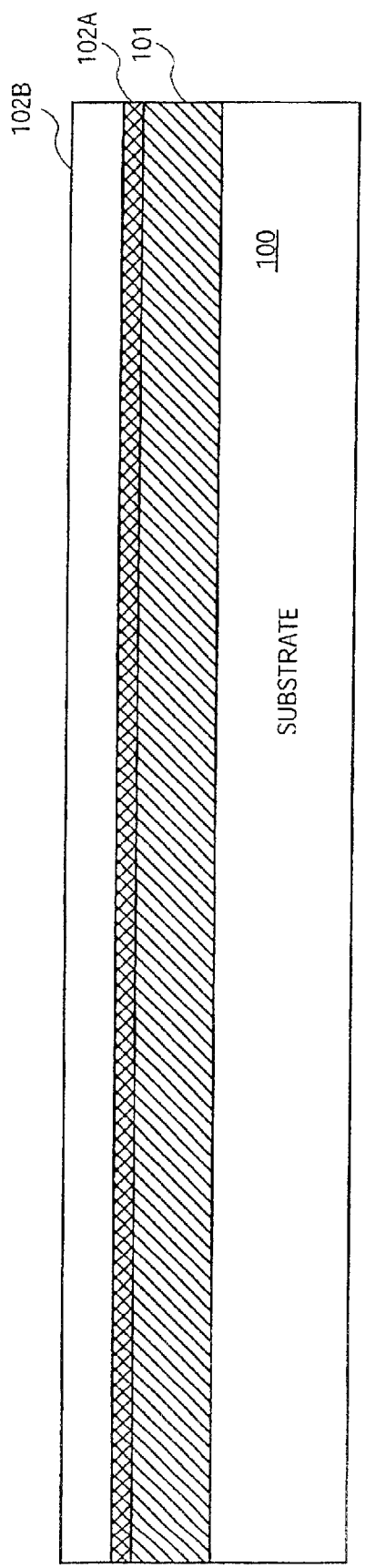
FIGS. 1A–1F illustrate cross-sections during the formation of a semiconductor device using the dual damascene process according to one embodiment of the invention.

FIGS. 1A–1F illustrate cross-sections during the formation of a semiconductor device using the dual damascene process according to one embodiment of the invention. As illustrated in FIG. 1A a patterned conductive layer 101 is formed on dielectric material on substrate 100. Substrate 100 may be any surface, generated when making an integrated circuit, upon which a conductive layer may be formed. Substrate 100 thus may include, for example, active and passive devices that are formed on a silicon wafer such as transistors, capacitors, resistors, diffused junctions, gate electrodes, local interconnects, etc. Substrate 100 also may include insulating materials that separate such active and passive devices from the conductive layer or layers that are formed on top of them, and may include previously formed conductive layers.

Conductive layer 101 may be made from materials conventionally used to form conductive layers for semiconductor devices. In one embodiment, conductive layer 101 includes copper, and may be formed using a conventional copper damascene process. Although copper is preferred, other conducting materials including but not limited to metal alloys, aluminum, gold, and silver may be used instead. In one embodiment, conductive layer 101 may be planarized after it is deposited, using for example, chemical mechanical polishing ("CMP").

After forming a patterned conductive layer 101 on dielectric material on substrate 100, a first barrier layer 102A, comprising non-organic materials (e.g., silicon nitride), is formed on conductive layer 101. After forming the first barrier layer 102A, a second barrier layer 102B, comprising silicon carbide, is formed on first barrier layer 102A. Both barrier layers 102A and 102B serve to prevent an unacceptable amount of copper, or other metal, from diffusing into dielectric layer 103 of FIG. 1B. In addition, barrier layer 102A also acts as an etch stop to prevent subsequent via etch steps from exposing conductive layer 101 to subsequent cleaning steps. Furthermore, first barrier layer 102A being comprised of non-organic materials, prevents organic contaminants from being deposited on the surface of conductive layer 101. Moreover, first barrier layer 102A prevents organic contaminants from other organic layers from being deposited on the surface of conductive layer 101.

Organic contaminants on the surface of conductive layer 101 is undesirable as the contact between conductive layer 101 and subsequent metal deposition on the surface of conductive layer 101 (e.g., metal deposition on the surface of conductive layer 101 in vias) may have a high interface resistance. The high interface resistance due to an electrically poor contact may cause the semiconductor device to fail. Moreover, the adhesion of silicon carbide (SiC) to copper (Cu) is not as good as the adhesion of silicon nitride ($Si_3N_4$) to copper.

First barrier layer 102A is preferably is made from silicon nitride. In one embodiment, first barrier layer 102A is less than 20 nanometers thick; preferably the thickness of first barrier layer 102A is between 1 nanometer and 7 nanometers.

Figure 1B:
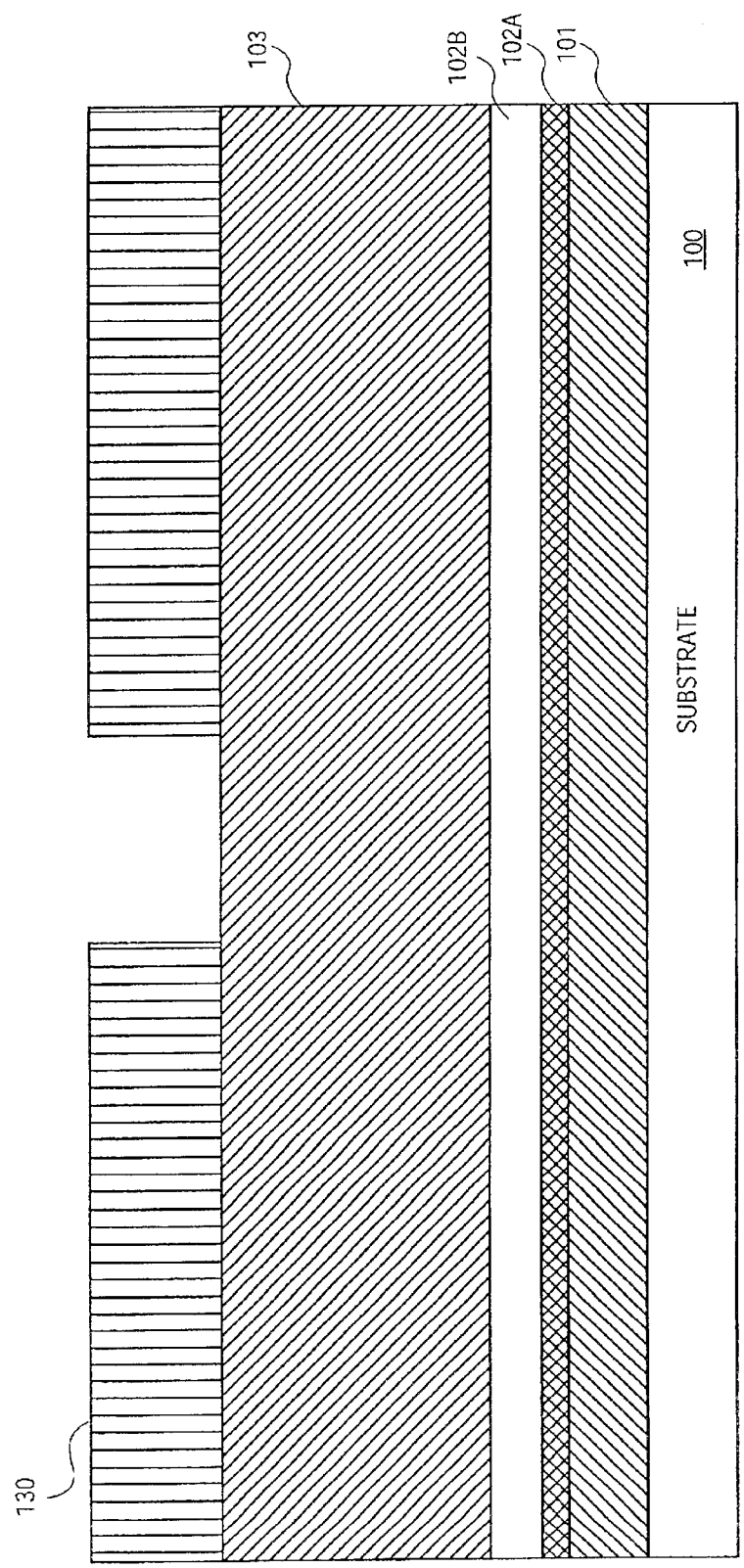

As stated earlier, after forming the first barrier layer 102A a second barrier layer 102B is formed on first barrier layer 102A. As illustrated in FIG. 1B, the second barrier layer 102B serves to further prevent an unacceptable amount of copper, or other metal, from diffusing into the dielectric layer 103 and serving as an etch stop layer. Silicon nitride comprising the first barrier layer 102A has a high k value and therefore a low k second barrier layer 102B is used to supplement the thickness of the first barrier layer, thereby acting as an etch stop layer and simultaneously maintaining an overall low value of k across the two barrier layers. The second barrier layer 102B is preferably made up of silicon carbide. In one embodiment, the thickness of the silicon carbide layer is less than 200 nanometers, preferably the thickness of the silicon carbide layer is between 10 nanometers and 200 nanometers, depending on the etch process selectivity.

Processes well known in the art e.g., a chemical vapor deposition process, a plasma enhanced chemical vapor deposition process, or even an atomic layer deposition process may be used to form barrier layers 102A and 102B. Barrier layers 102A and 102B should be thick enough to perform its copper diffusion inhibition and etch stop functions, but not so thick that it adversely impacts the overall dielectric characteristics resulting from the combination of barrier layers 102A and 102B and dielectric layer 103. FIG. 1A illustrates a cross-section of the structure that results after conductive layer 101 and barrier layers 102A and 102B have been formed on substrate 100.

After the second barrier layer 102B is formed on the surface of the first barrier layer 102A, photoresist layer 130 may be patterned using conventional photolithographic techniques, such as masking the layer of photoresist, exposing the masked layer to light, then developing the unexposed portions on the surface of the second barrier layer 102B. The resulting structure is shown in FIG. 1B.

Figure 1C:
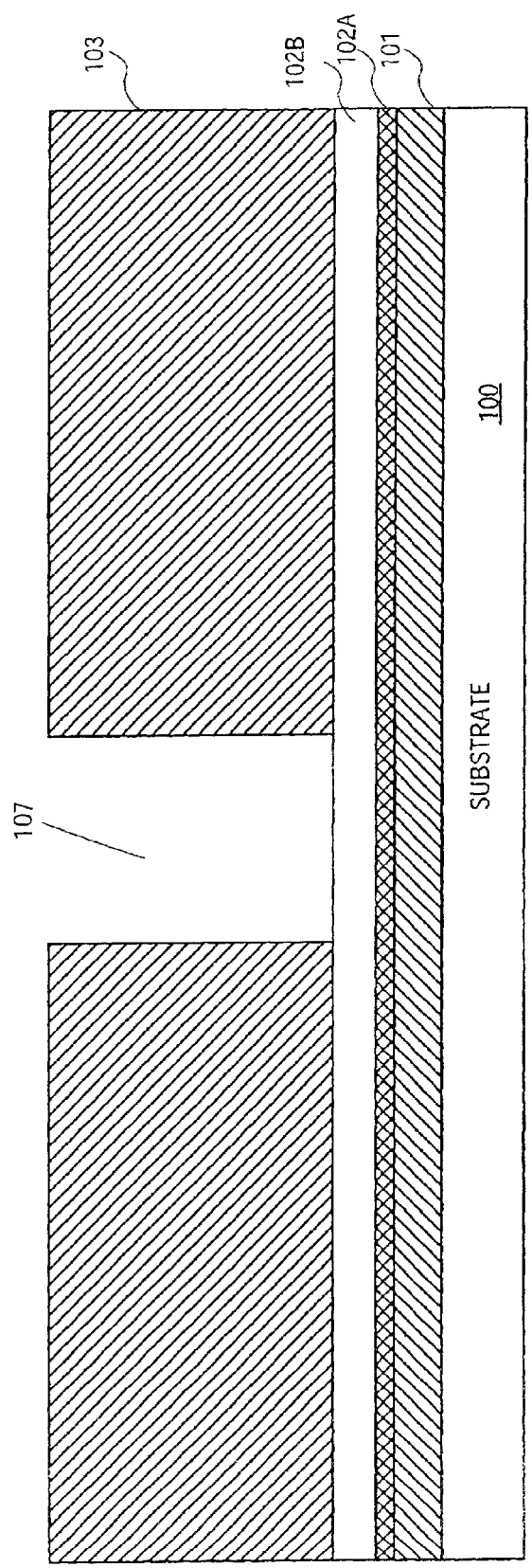

After photoresist layer 130 is patterned, via 107 as illustrated in FIG. 1C is etched through dielectric layer 103, down to barrier layer 102B, followed by removing the photoresist generating the structure shown in FIG. 1C. Conventional process steps for etching through a dielectric layer may be used to etch the via, e.g., a conventional anisotropic dry oxide etch process, or a conventional photoresist strip process. However, if a conventional photoresist strip process is used, a post ash clean may be needed to remove any residues after the photoresist strip process.

Another process for making a semiconductor device includes filling via 107 with a bottom anti reflective coating (BARC) e.g., a sacrificial light absorbing material (SLAM). The SLAM may comprise a dyed spin-on-polymer (SOP) or dyed spin-on-glass (SOG) that has dry etch properties similar to that of dielectric layer 103. The SLAM may be deposited by spin coating well known in the art. The type of SLAM used may depend upon the type of material used to form dielectric layer 103 e.g., if dielectric layer 103 is formed from silicon dioxide, using an SOG material to form the SLAM yields a better match between their respective etch rates. If dielectric layer 103 is formed from a polymer, then forming SLAM from an SOP material may produce a combination of materials having the desired selectivity. By filling via 107 with SLAM, substrate reflection that occurs during trench lithography—which could adversely affect dual damascene via and trench formation—may be reduced or eliminated. Filling via 107 with SLAM may eliminate the need to use etch chemistry to etch the trench that is highly selective to dielectric layer 103 over barrier layer 102A, to ensure that the trench etch step will not etch through barrier layer 102A. After filling via 107 with SLAM, the photoresist layer 130 may be patterened to define a trench formation region. In one embodiment, the etch chemistry chosen to etch the trench should remove the SLAM at about the same rate that it removes dielectric layer 103. Typically, SLAM is removed after the trench etch and ash process.

Figure 1D:
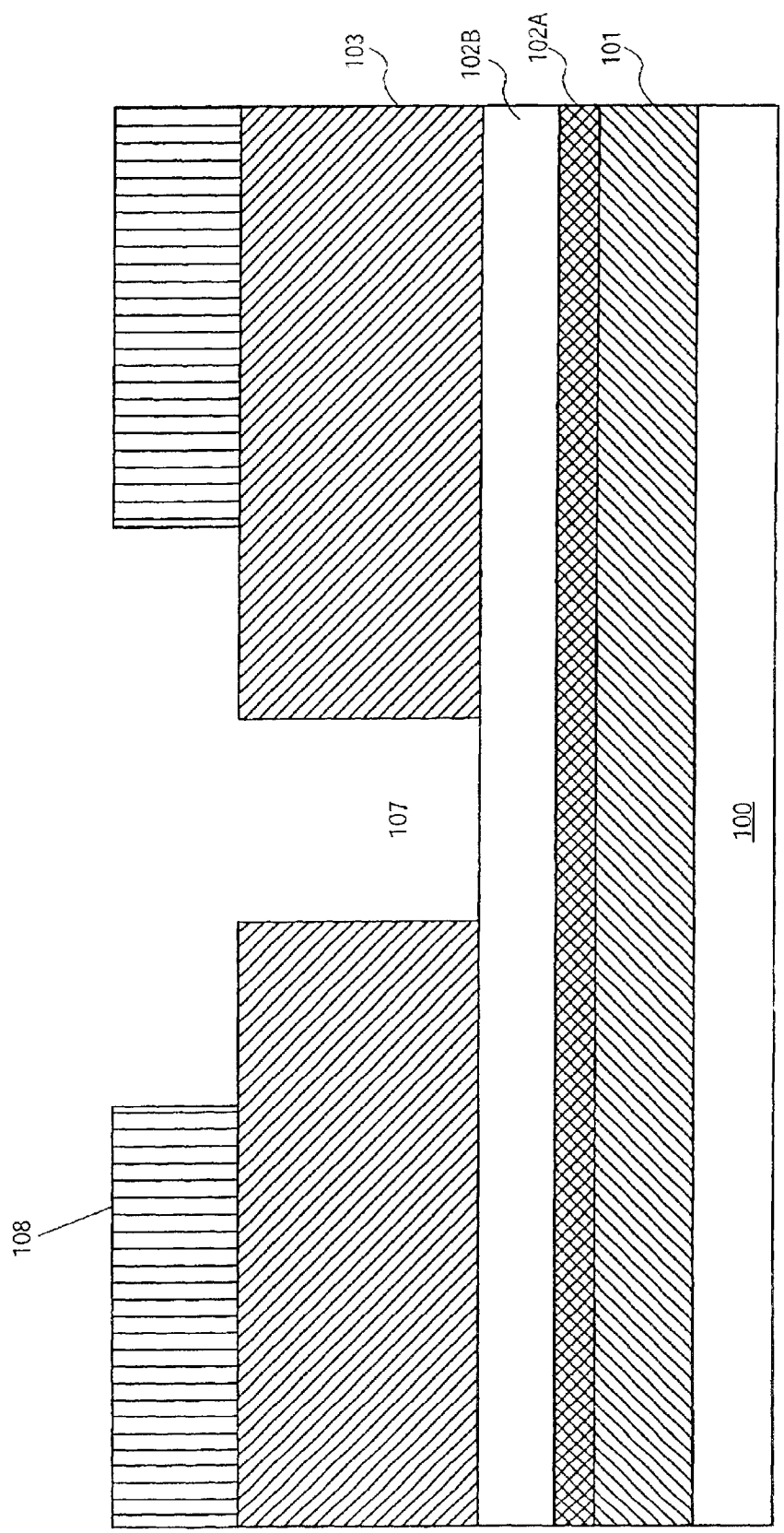
Figure 1E:
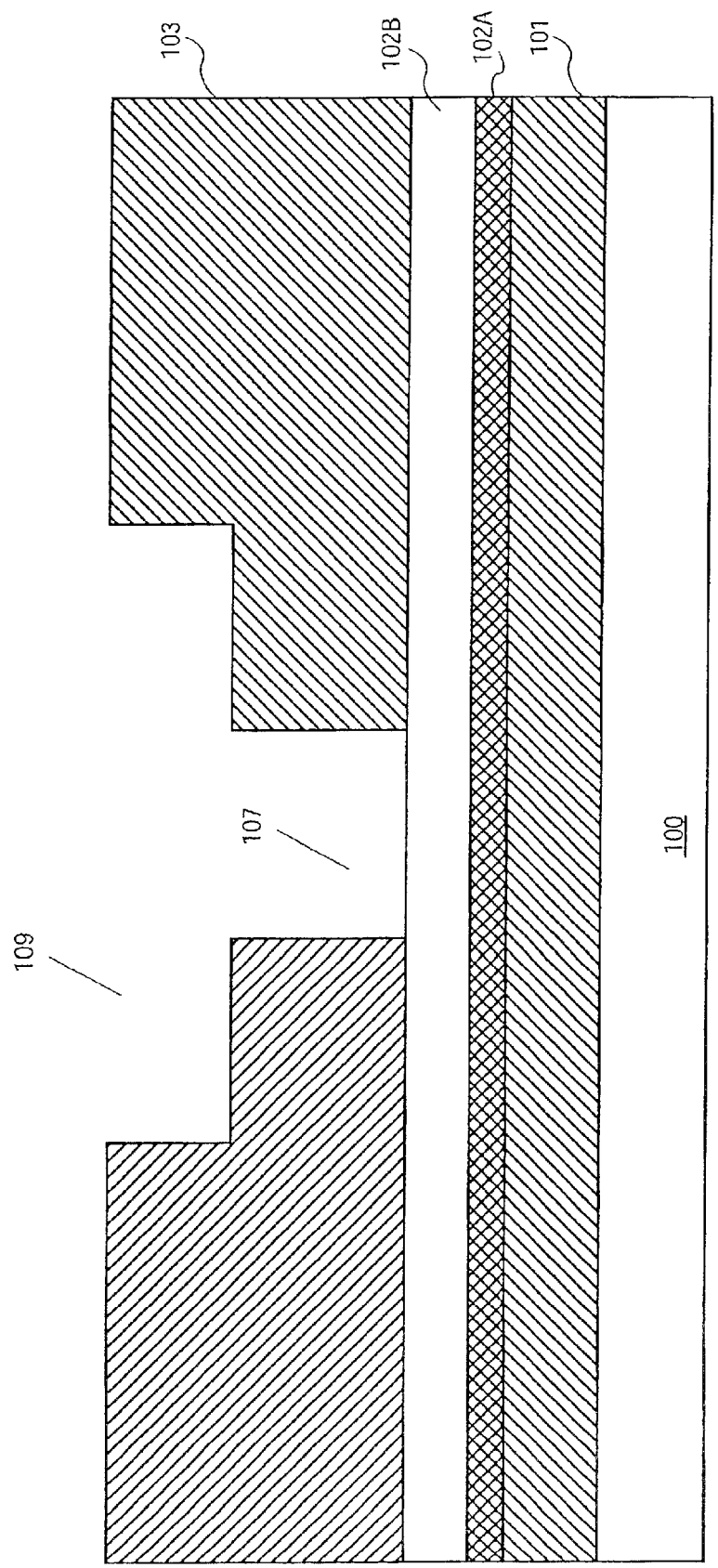

After etching via 107, via 107 and the surface of dielectric layer 103 may need further cleaning. In one embodiment, after forming via 107 a trench may be formed by patterning a second layer of photoresist 108 as illustrated in FIG. 1D. FIG. 1E illustrates the resultant structure showing a via and a trench after etching through a second portion of dielectric layer 103. After forming via 107 and trench 109, the formed via and trench may be cleaned by using a conventional cleaning chemicals, as is well understood by those skilled in the art. Although the process illustrates forming a via followed by forming a trench one skilled in the art will appreciate that a trench may be formed followed by forming the via.

Figure 1F:
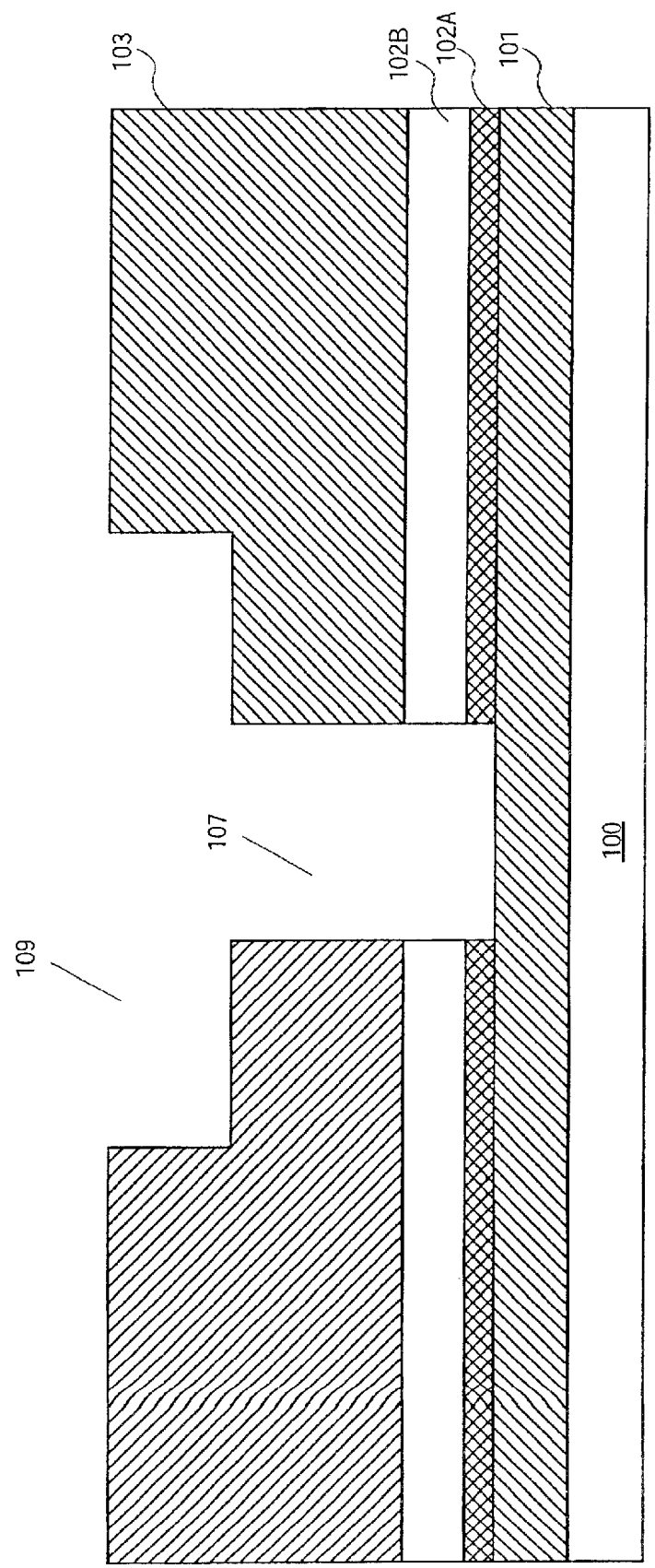

After the via and the trench are formed, the portion of the barrier layers 102B and 102A that separates via 107 from conductive layer 101 may be removed to expose conductive layer 101 as shown in FIG. 1F. In one embodiment, silicon carbide barrier layer 102B and silicon nitride barrier layer 102A are etched using a single etch pass. One skilled in the art will appreciate that the same gasses may be used to etch both the silicon carbide layer and the silicon nitride layer. In other embodiments, different gasses may be used to etch each barrier layer.

The process of the present invention provides a way to prevent via poisoning (i.e., prevents the contamination of vias due to the presence of organic materials) by using dual barrier layers comprising a layer of silicon carbide formed on a layer of silicon nitride.

Thus, a method has been disclosed to prevent via poisoning (i.e., prevents the contamination of vias due to the presence of organic materials) by using dual barrier layers comprising a layer of silicon carbide formed on a layer of silicon nitride. While there has been illustrated and described what are presently considered to be example embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A method of forming a semiconductor device comprising:

forming a first patterned conductive layer on a dielectric material on a substrate;

forming a non-organic first barrier layer on a surface of the first patterned conductive layer;

forming a second barrier layer of silicon carbide on a surface of the non-organic first barrier layer;

forming a dielectric layer on a surface of the second barrier layer; and forming one of a via and a trench through a first portion of the dielectric layer and through a first portion of one of the non-organic first barrier layer and second barrier layer;

wherein the non-organic first barrier layer and second barrier layer are to prevent diffusion of metal from the first patterned conductive layer into the dielectric layer.

2. The method of claim 1 further comprising forming the trench through a second portion of the dielectric layer when the via is formed through the first portion of the dielectric layer.

3. The method of claim 1, wherein said one of the via and the trench is filled with a sacrificial light absorbing material.

4. The method of claim 1 further comprising forming the via through a second portion of the dielectric layer if when the trench is formed through the first portion of the dielectric layer.

5. The method of claim 1 further comprising forming said one of the via and the trench through the second barrier layer followed by forming said one of the via and the trench through the non-organic first barrier layer.

6. The method of claim 5 wherein said one of the via and the trench is formed through the non-organic first barrier layer and the second barrier layer with a single etch pass.

7. The method of claim 1 wherein the non-organic first barrier layer comprises a thickness of less than 20 nanometers of silicon nitride.

8. The method of claim 7 wherein the non-organic first barrier layer comprises a thickness of between 1 nanometer and 7 nanometers of silicon nitride.

9. The method of claim 7 wherein the silicon nitride is deposited using one of a plasma enhanced chemical vapor deposition process, a chemical vapor deposition process and an atomic layer deposition process.

10. The method of claim 1 wherein the second barrier layer comprises a thickness of less than 200 nanometers.

11. The method of claim 10 wherein the silicon carbide is deposited using one of a plasma enhanced chemical vapor deposition process, a chemical vapor deposition process and an atomic layer deposition process.

12. A method of forming a semiconductor device comprising:

forming a first patterned conductive layer on a dielectric material on a substrate;

forming a first barrier layer comprising silicon nitride on a surface of the first patterned conductive layer;

forming a second barrier layer comprising silicon carbide on a surface of the first barrier layer;

forming a dielectric layer on a surface of the second barrier layer;

forming, through a first portion of the dielectric layer, either of a via and a trench;

forming either of the via or the trench through the second barrier layer; and forming either of the via or the trench through the first barrier layer with an etchant different from that used for forming either of the via or the trench through the second barrier layer.

13. The method of claim 12 further comprising forming the trench through a second portion of the dielectric layer when the via is formed through the first portion of the dielectric layer.

14. The method of claim 12, wherein said either of the via and the trench is filled with a sacrificial light absorbing material comprising at least one of a dyed spin-on polymer and a dyed spin-on glass with dry etch properties similar to the dielectric layer.

15. The method of claim 12 further comprising forming the via through a second portion of the dielectric layer when the trench is formed through the first portion of the dielectric layer.

16. The method of claim 12 wherein the first barrier layer comprises a thickness of between 1 nanometer and 7 nanometer of silicon nitride.

17. The method of claim 12 wherein the second barrier layer comprises a thickness of less than 200 nanometers of silicon carbide.

18. The method of claim 12 wherein at least one of the silicon nitride and the silicon carbide is deposited using one of a plasma enhanced chemical vapor deposition process, a chemical vapor deposition process and an atomic layer deposition process.

* * * * *